United States Patent [19]

Anthony et al.

[11] Patent Number: 4,570,173
[45] Date of Patent: Feb. 11, 1986

[54] HIGH-ASPECT-RATIO HOLLOW DIFFUSED REGIONS IN A SEMICONDUCTOR BODY

[75] Inventors: Thomas R. Anthony, Schenectady; Douglas E. Houston, Liverpool; James A. Loughran, Scotia, all of N.Y.

[73] Assignee: General Electric Company, Schenectady, N.Y.

[21] Appl. No.: 544,935

[22] Filed: Oct. 24, 1983

Related U.S. Application Data

[63] Continuation-in-part of Ser. No. 267,235, May 26, 1981, abandoned.

[51] Int. Cl.[4] ............................................. H01L 29/06
[52] U.S. Cl. ........................................ 357/20; 357/30; 357/32; 357/55; 357/88
[58] Field of Search ..................... 357/20, 88, 32, 30, 357/55; 372/10, 11, 12

[56] References Cited

U.S. PATENT DOCUMENTS

| | | | |
|---|---|---|---|
| 3,323,198 | 6/1967 | Shortes | 357/68 |
| 3,372,070 | 3/1968 | Zuk | 357/88 |
| 3,414,733 | 12/1968 | Wunderman | 357/32 |
| 3,569,758 | 3/1971 | Horiuchi | 357/55 |
| 3,899,361 | 8/1975 | Cline et al. | 148/1.5 |
| 3,901,736 | 8/1975 | Anthony et al. | 148/1.5 |
| 4,030,116 | 6/1977 | Blumenfeld | 357/32 |
| 4,075,038 | 2/1978 | Anthony et al. | 148/1.5 |
| 4,091,257 | 5/1978 | Anthony et al. | 219/121 EB |
| 4,110,122 | 8/1978 | Kaplow et al. | 357/20 |
| 4,137,100 | 1/1979 | Zaleckas | 148/1.5 |
| 4,174,504 | 11/1979 | Chenausky et al. | 372/11 |
| 4,224,594 | 9/1980 | Anthony et al. | 338/32 R |
| 4,227,942 | 10/1980 | Hall | 357/55 |
| 4,239,586 | 12/1980 | Ghez et al. | 156/644 |

OTHER PUBLICATIONS

Joy et al., "Isolated Power Feed-Through Holes", *IBM Technical Disclosure Bulletin,* vol. 16, No. 11, pp. 3592-3593 (1974).

*Primary Examiner*—Martin H. Edlow
*Assistant Examiner*—Jerome Jackson, Jr.
*Attorney, Agent, or Firm*—Leo I. MaLossi; James C. Davis, Jr.; James Magee, Jr.

[57] ABSTRACT

A semiconductor device and a method for its preparation are disclosed, wherein a semiconductor body has at least one bore extending completely or partially therethrough, this bore being defined by a semiconducting region having a conductivity type opposite to, and resistivity lower than, the material of the body contiguous to the bore-defining semiconducting region, this bore having a substantially constant diameter of less than about 1.5 mils and an average length-to-diameter ratio of at least about 6:1.

6 Claims, 12 Drawing Figures

U.S. Patent   Feb. 11, 1986   Sheet 1 of 4   4,570,173
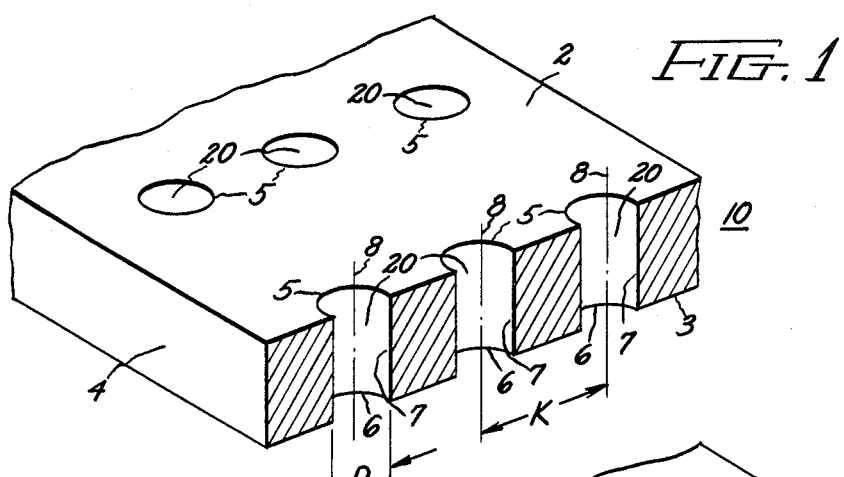
FIG. 1
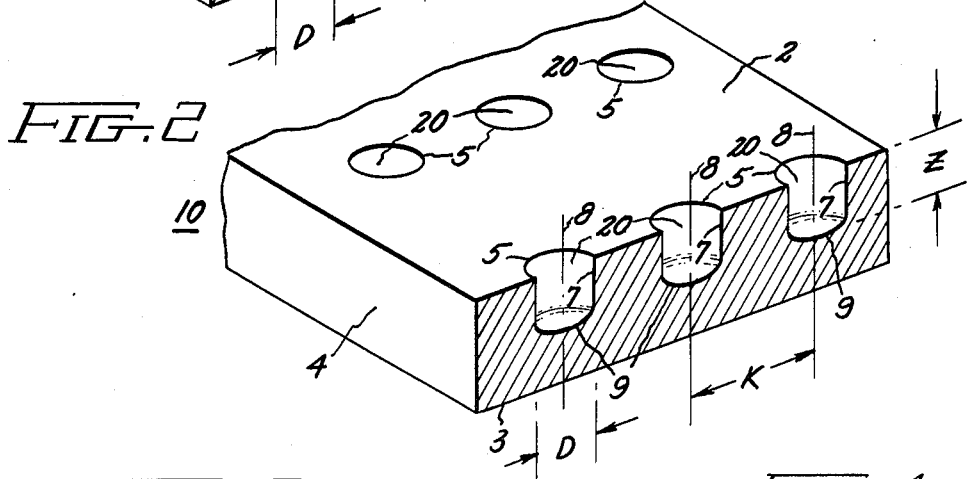
FIG. 2
FIG. 3
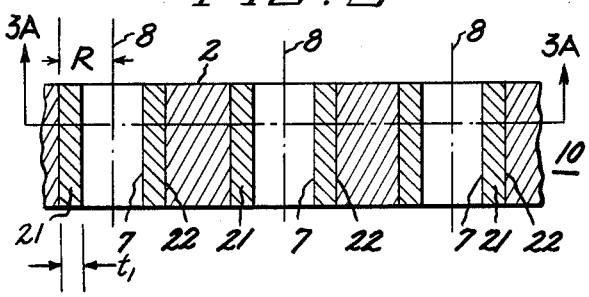
FIG. 3A
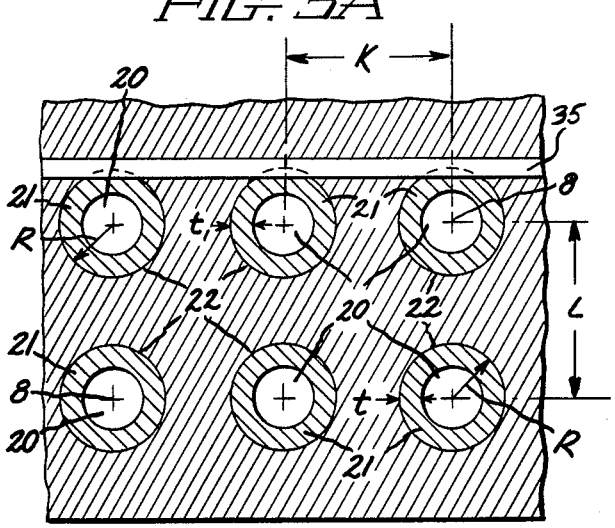
FIG. 4
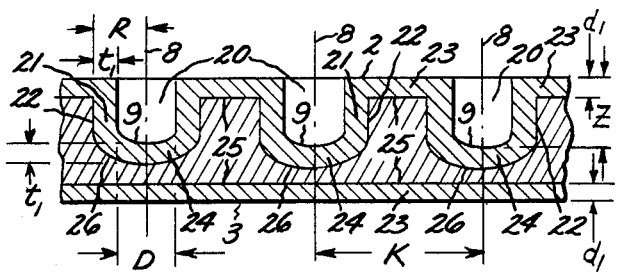
FIG. 5
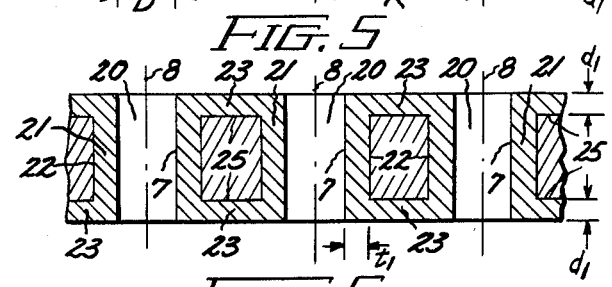
FIG. 6
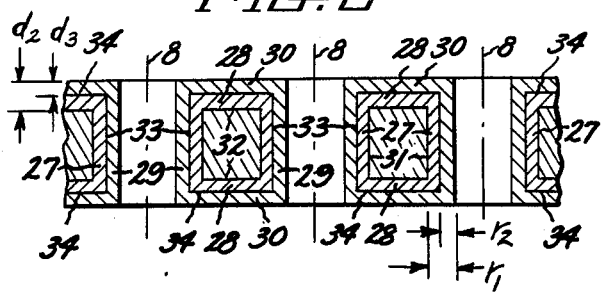

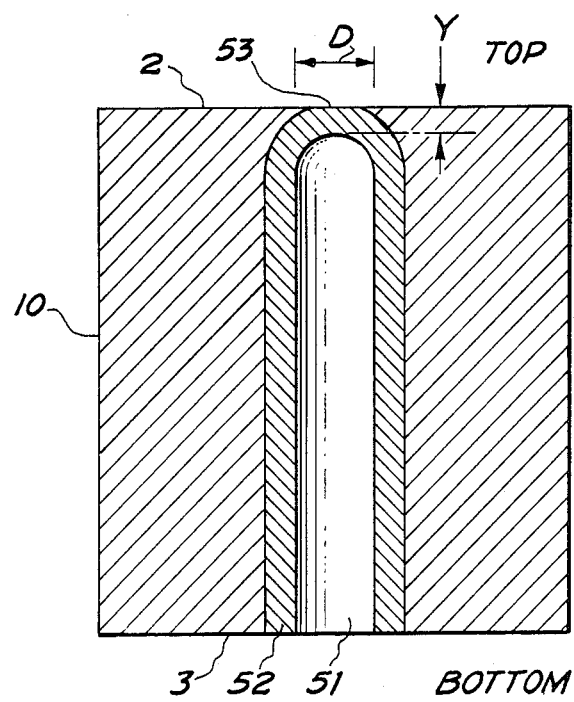

HIGH-ASPECT-RATIO HOLLOW DIFFUSED REGIONS IN A SEMICONDUCTOR BODY

This application is a continuation-in-part of U.S. patent application Ser. No. 267,235—Anthony et al., filed May 26, 1981 and now abandoned. The invention herein is related to the invention disclosed and claimed in U.S. patent application Ser. No. 282,218, now U.S. Pat. No. 4,527,183. This invention is also related to the invention disclosed and claimed in U.S. patent application Ser. No. 293,760, now U.S. Pat. No. 4,471,369. U.S. Pat. No. 4,471,369 and U.S. Pat. No. 4,527,183 are assigned to the assignee of the instant application, U.S. Pat. No. 4,527,183 being incorporated by reference.

FIELD OF THE INVENTION

This invention relates broadly to the semiconductor arts and more particularly to a method for making semiconductor regions of generally uniform cross-section substantially concentric with small diameter, high-aspect-ratio bores that extend completely or partially through semiconductor bodies and to semiconductor devices produced by the method.

BACKGROUND OF THE INVENTION

For a number of electronic devices, high-aspect-ratio semiconducting regions, e.g diodes and isolation grids, extending into or through the thickness of a semiconductor body are desirable.

Direct diffusion of an impurity through the thickness of a semiconductor body from the top surface to the bottom surface through solid material requires diffusion times that are longer than desirable from a productivity standpoint. The semiconducting regions produced by direct diffusion through the solid semiconductor material generally spread further laterally into the interior of the body, away from a path straight through the body, than is desired. The junctions produced between the diffused regions and the body by direct diffusion are generally irregular, e.g. hour-glass shaped, when viewed in the cross-section of the body when the impurity has been diffused from both top and bottom surfaces. These undesirable characteristics of directly diffused through-thickness semiconducting regions become more pronounced as the thickness of the body is increased to provide added strength as the surface dimensions are increased to provide more area for active device fabrication.

Methods are available for enhancing the production of through-thickness regions in semiconductor bodies. One method, such as is described in U.S Pat. No. 4,227,942, involves the use of a chemical etch to expose areas interior to and beneath the surface of the body. These etchants are generally slow acting, produce holes whose dimensions are sensitive to thickness variations unless special procedures are followed, and are sensitive to crystallographic orientations within the body, i.e., the etchants are anisotropic. Since the etchants are anisotropic, the holes produced are typically in the form of truncated tetrahedrons. Hourglass-shaped openings through a semiconductor wafer having semiconducting regions of opposite type lining each opening are shown in "Isolated Power Feed-Thru Holes" by R. C. Joy and W. J. Nestork (IBM Technical Disclosure Bulletin, Vol 16, No. 11, Apr. 1974).

Other methods, such as the one described in U.S. Pat. No. 4,137,100, involve the formation of excavations, i.e., pits or trenches, in the substrate to allow the diffusion processes to commence from levels below the surface of the body. If a laser beam is used to form the excavations, either before or after the impurity is applied, the diffusion time and lateral spreading are decreased, but at the expense of damage, in the form of dislocations or diffusion pipes, to the semiconductor body.

Two additional methods of producing through-thickness diodes are thermal gradient zone melting (TGZM) and electromigration. The advantages of these methods are that they are rapid and produce high quality junctions. The basic nature of the TGZM and electromigration processes, however, limits the choice of impurities which may be used to establish the desired conductivity type and resistivity level of the semiconductor regions relative to that which can be obtained by the more conventional diffusion technology. Further, as the size of the semiconductor regions decreases below about 10 mils, the practice of TGZM and electromigration become increasingly difficult and complex.

BRIEF DESCRIPTION OF THE INVENTION

A semiconductor device and a method for its preparation are disclosed, wherein a semiconductor body has at least one bore extending completely or partially therethrough, this bore being defined by a semiconducting region having a conductivity type opposite to, and resistivity lower than, the material of the body contiguous to the bore-defining semiconducting region, this bore having a substantially constant diameter of less than about 1.5 mils and an average length-to-diameter ratio of at least about 6:1.

Briefly described, the method of the invention comprises the steps of forming, by the use of laser drilling at low to medium power multipulse operation, one or more bores (dimensioned as described above) extending completely or partially through the thickness of a semiconductor body and then subjecting at least the inside surface of the bore to an appropriate impurity under conductions causing the impurity to be diffused inwardly from the inside surface of the bore. The body may be of any semiconductor material of any crystallographic orientation.

By exposing the bore to more than one impurity-diffusing step, a plurality of contiguous semiconductor regions may be formed substantially concentric with the bore. Whatever the existing conductivity type and resistivity of the semiconductive inside surface of the bore, the next impurity atom and its concentration are selected so as to produce semiconductivity of the opposite conductivity type and of lower resistivity.

Generally, in the construction of practical devices, but not necessarily, additional processing steps will be carried out. Such additional processing steps may provide, for example, active devices in contact with the semiconductor regions, means for addressing the regions, or possibly combinations of the two.

A device, made by the process will comprise a body of semiconductor material having least one small diameter, high-aspect-ratio bore as described hereinabove. At least one semiconducting region is, therefore, located substantially concentric with the bore. Thus, in the case of a bore that passes through the body, the concentric semiconducting region of desired thickness will, essentially in the form of a hollow cylinder, also extend through the body. With a bore that extends partially through the body the semiconducting region of desired thickness will have a configuration throughout shaped like the inside surface of the bore. In one special construction of the partially penetrating bore, the bottom of the bore is close enough to the outer surface of the body that the semiconducting material defining the bottom of the bore extends to this outer surface where it is generally circular in area.

Generally, in practical devices, there will be a plurality of such bores, and associated substantially concentric semiconductor regions, arranged in a predetermined array. In some devices the proximity of adjacent bores may be such that the semiconductor regions partially overlap. Further, depending upon the specific nature and function of the device, there may be a plurality of semiconductor regions generally concentric with each bore. In most practical devices, but not necessarily, there will additionally be, for example, active devices in contact with the regions, means for addressing the regions, or possibly combinations of the two.

BRIEF DESCRIPTION OF THE DRAWINGS

FIG. 1 is a schematic perspective representation in partial cross-section of a portion of a body of semiconductor material having a plurality of bores laser-drilled through the thickness of the body and arranged in an array;

FIG. 2 is a schematic perspective representation in partial cross-section of a portion of a body of semiconductor material having a plurality of bores laser-drilled partially through the thickness of the body and arranged in an array;

FIG. 3 is a schematic elevational view of the cross-sectioned face of the body of FIG. 1 following the formation of semiconductor regions concentric with the bores;

FIG. 3A is a sectional view taken along plane 3A—3A of FIG. 3;

FIG. 4 is a schematic elevational view of the cross-sectioned face of the body of FIG. 2 following formation of (a) semiconductor regions concentric with and defining the bores, (b) semiconducting regions contiguous with and underlying the top and bottom major surfaces and (c) semiconducting regions defining the bottom surfaces of the bores;

FIG. 5 is a schematic elevational view of the cross-sectioned face of the body of FIG. 1 following the formation of semiconductor regions concentric with and defining the bores and semiconductor regions adjacent to and underlying the top and bottom major surfaces;

FIG. 6 is a schematic representation illustrating the body of FIG. 5 after the diffusion of a second impurity in the bores;

FIG. 11 shows a special arrangement by which electrical connectivity to an internal diode can be established at one major surface of the semiconducting body without penetrating or damaging that surface.

DETAILED DESCRIPTION OF THE INVENTION

Figure 7:
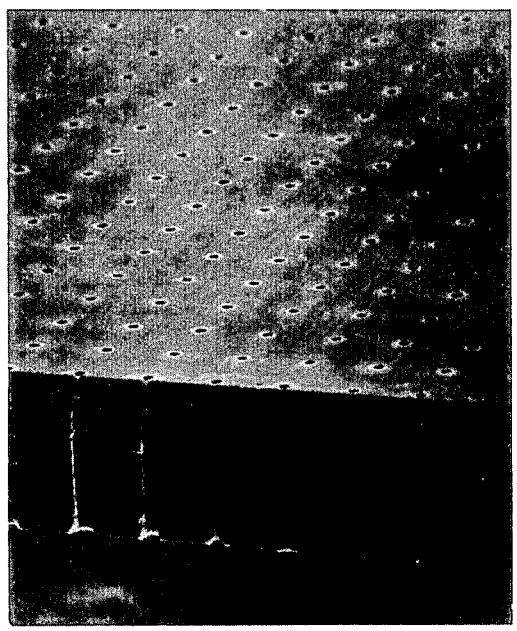
FIG. 7 is a scanning electron micrograph at 100× of a portion of a 200×200 square matrix array of bores, approximately 1 mil in diameter and arranged on centers approximately 5 mils apart, laser drilled through a 12 mil thick silicon wafer. The front surface seen in cross-section has been cut on a diagonal plane, which is substantially perpendicular to the top and bottom major surfaces, to show progressively larger cross-sections of adjacent bores.

In practicing of our invention, which can be more readily understood in conjunction with the appended FIGURES, one or more bores 20 are drilled either completely or partially through semiconductor body 10, as shown in FIGS. 1 and 2, respectively.

The specific geometry afforded body 10 will be determined by its end use, but thin (i.e., on the order of about 6 to about 100 mils thick) wafers and square or rectangular chips of semiconducting material are common. Body 10 will have at least first (or top) 2 and second (or bottom) 3 major opposed surfaces and an outer peripheral edge area 4 interconnecting the major surfaces. Neither the geometry nor the crystallography of body 10 is a critical factor in the practice of our invention. The semiconductor material of body 10 may be selected from those which are known by the practitioners of the art of the construction of semiconductor or microelectronic devices. Suitable materials include silicon, germanium, silicon carbide, compounds of a group III element and a group V element (e.g., gallium arsenide), compounds of a group II and a group VI element (e.g., cadmium telluride) or combinations thereof.

Bores 20 are interior longitudinally-extending cylindrical cavities having inner bore surfaces 7 either interconnecting apertures 5 and 6 lying in the planes of major surfaces 2 and 3, respectively, as in FIG. 1, or interconnecting an aperture (such as aperture 5) lying in the plane of one of the major surfaces and the bore bottom (e.g. surface 9 of bores 20) as in FIGS. 2 and 11. As used herein, unless otherwise specified, the term "cylindrical" is used to describe the surface traced by a straight line moving parallel to a fixed straight line and intersecting a circle. When dealing with holes with length-to-diameter ratios greater than 20, the walls of the hole tend to have some taper with the entrance diameter of the hole being slightly larger than the exit diameter of the hole. As used herein and in the appended claims, the term "hole" is considered equivalent to the term "bore". Bore axis 8, which extends between the centers of apertures 5 and 6 or between the centers of an aperture and bore bottom surface 9, is substantially parallel to inner bore surface 7.

Bores 20 have a high-aspect-ratio, i.e., a length-to-diameter ratio at present in the range of from about 6:1 to about 50:1. The aspect ratios at the higher end of this range require very sophisticated optics to enable the careful focusing required. It is expected that as this equipment is improved and made commercially available, this ratio can increase. Although the laser does not "drill" the bores in the classical sense of the word, we have chosen to adopt the term "drill" in connection with that aspect of our invention wherein bores are provided by laser beam means.

One laser employed was an ESI, Inc. Model 25 Laser Scribing System modified with a 10 watt (maximum) optoacoustic Q-switched Nd:YAG head manufactured by U.S. Laser Corp. The laser was operated in a repetitively Q-switched mode with a focused beam size of about 20 microns, a depth of focus of about 250 microns, an individual pulse duration of about 200 nanoseconds and a repetition rate of about 3 KHz. At a power level of about 2 watts, measured independently in a continuously pulsed mode, ten pulse trains of 5 msec duration separated by a 10 msec delay were used to drill approximately 5 holes per second. By carefully controlling the number of pulses from a laser operating with the above-described parameters, blind bores extending partially through the thickness of semiconductor body 10, as shown in FIG. 2, can be reproducibly produced. A calibration curve of depth of bore versus number of pulses can easily be constructed to aid the practitioner in drilling bores of uniform depth or a programmed array of bores having varying depths.

Generally selection of a suitable laser can be made for the practice of this invention employing the following criteria:

(a) Nd:YAG;
(b) Q-switched;
(c) wave length: 1.06 microns (or shorter by frequency doubling);
(d) pulse length: 200 nanoseconds or shorter; and
(e) spacing between pulses: 1–3 kHz.

We discovered, when laser drilling a semiconducting body resting upon and in contact with a metallic surface, that reflection of the laser beam from the metallic surface caused the beam to wander and produce irregularly sized bores, particularly as the beam closely approached the reflective surface. Therefore, we invented means for holding the body away from the reflective surface while still utilizing a vacuum to hold it in place. An additional benefit of using such an arrangement was that pieces of debris were ejected downwardly away from bottom surface 3 of body 10 leaving a clean, well-defined aperture 6 in bottom surface 3 when bores 20 were drilled completely through body 10.

Bores 20 need not be drilled in such a fashion that axes 8 are mutually parallel. As disclosed in the above cross-referenced Ser. No. 282,218 application, certain advantages accrue to having axes 8 tilted in a programmed fashion in such devices as imagers and radiation detectors.

Some surface blemishes, caused by the fallout of debris from the bores during drilling, were observed when drilling was done on bare silicon wafers. These blemishes were eliminated by precoating both sides of the wafer with black acrylic spray paint and removing that coating in toluene after drilling. The debris from each drilled bore were washed away with the protective paint coating. Other coatings such as photoresist, paraffin, or silicone grease should work equally as well as acrylic spray, but are less easily removed than acrylic spray paint.

Following the formation of bores 20 in semiconductor body 10, body 10 is processed to form at least one semiconductor region 21 defining each bore 20, as shown schematically in the drawings, by introducing a first impurity into body 10 through inner surface 7 of each bore 20. As used herein and in the appended claims, the term "concentric" refers to two or more geometric figures which are symmetric with respect to the same reference axis or axes.

Semiconductor region 21 will have a conductivity type opposite to, and an impurity atom concentration (commonly measured in terms of resistivity) greater than, that of semiconductor body 10. Regions 21 are bound by inner bore surfaces 7 and interfaces 22 with the material of body 10. Interfaces 22 are substantially concentric with bores 20 and are situated away from inner bore surfaces 7 by the distance (R), measured radially from bore axes 8 in FIGS. 3 and 3A, to which the impurity diffuses into body 10 from inner bore surfaces 7. In the case of through-holes, regions 21 essentially will be in the shape of hollow cylinders; in the case of blind holes (as in FIG. 4) regions 21 will be in the shape of hollow cylinders closed at the bottom. Interfaces 22 will be P-N junctions.

There are several techniques by which regions 21 may be made. One technique, using a relatively new solid state source of diffusable impurity, is described in Example I below. Another technique, commonly practiced in the semiconductor arts, is the diffusion of an impurity in gaseous form for a preselected time at a preselected temperature and is illustrated in Example II below.

There exists the question of the minimum bore diameter which can be doped effectively by means of gaseous diffusion. This question can be answered by calculating the gas diffusion coefficient in pores and determining the diffusion relaxation time for our particular bores in the silicon wafers.

In gas, the diffusion constant, $D_G$, is given by:

$$D_G = \tfrac{1}{3}VL \qquad (1)$$

where V is the average velocity of the gas molecule and L is the mean free path.

In a very small pore, the diffusion coefficient, $D_p$, may be limited by the pore size:

$$D_p = \tfrac{2}{3}VR \qquad (2)$$

were V is the average velocity of the gas molecule and R is the radius of the pore. The net diffusion coefficient D down the pore is obtained by combining equations (1) and (2) to give the Bosanquet relation:

$$1/D = 3/V[1/L + 1/2R] \qquad (3)$$

From eq (3), it can be seen that the pore size does not limit gas diffusion down a pore unless the pore radius is less than ten times the mean free path. At atmospheric pressure, the mean free path L is about 500 A. Thus, under normal gas diffusing conditions, the size of the laser-drilled bore, even if it is only one micron (10,000 A or 0.039 mils) in diameter, will not limit gas diffusion down the bore.

Although diffusion of gas may proceed normally in a laser-drilled bore, there is a chance that the time required to resupply impurity down the bore, the diffusion relaxation time T, may be excessive. T can be calculated from eq. (4):

$$T = X^2/4D \qquad (4)$$

where X is the bore length and D again is the gas diffusion constant. For silicon wafers 11 mils (275 microns) thick, $X = 275 \times 10^{-2}$ cm. Also, at atmospheric pressure, $D \sim 0.2$ cm$^2$/sec. Thus, the diffusion relaxation time for laser-drilled bores in silicon is only one millisecond. Consequently, there is a negligible concentration gradient of gaseous impurity in the bore so that diffusion at all positions in the bore and on the major surfaces of the wafer takes place under identical conditions.

Those skilled in the manufacture of semiconductor devices will recognize that unless special measures are taken, the impurity will also diffuse into the interior of body 10 from other exposed surfaces, e.g., surfaces 2 and 3.

In FIG. 5, the impurity has diffused via top 2 and bottom 3 surfaces into semiconductor body 10 to a depth, $d_1$, below surfaces 2 and 3, forming layer-like regions 23 which underlie and are contiguous with surfaces 2 and 3 and intersect regions 21. As noted above, the diffusion kinetics are substantially the same at surfaces 2 and 3 as at inner bore surface 7, for bores having diameters greater than about 1 micron, thus $t_1$ and $d_1$ will generally be equal. Interfaces 25 are formed between regions 23 and the material of semiconductor body 10 and intersect interfaces 22. Although regions 21 and 23 are continuous and were formed simultaneously, we have chosen to conceptualize them, as well as the regions of FIG. 5, as separate regions for ease of description.

In FIG. 4 the impurity has also diffused into semiconductor body 10 from top 2 and bottom 3 surfaces and from bore bottom surfaces 9 forming semiconductor regions 23, 24, and 25 in addition to regions 21. Thus, in FIG. 4, region 23 underlies and is contiguous with surface 2 and intersects regions 21 formed by diffusion of the impurities upwardly from inner bore surface 7. A similar layer-like region 23 underlies and is contiguous with surface 3 and forms interface 25 with the material of body 10. Contoured regions 24 underlie and define bore bottom surfaces 9 substantially following the contour of these surfaces, and intersect regions 21. Interfaces 25 are formed, at a depth $d_1$ below surfaces 2 and 3, between regions 23 and the initial material of semiconductor body 10. Contoured interfaces 26 are formed between the contoured regions 24 and the initial material of semiconductor body 10 and are displaced from bottom surfaces 9 by a substantially uniform distance, $t_1$, along their lengths. Interfaces 25 adjacent to surface 2 and interfaces 26 intersect interfaces 22 to form a unitary continuous interface.

Growth of an oxide layer on a preselected surface is one method by which diffusion from that surface may be prevented. Alternatively, sufficient amounts of body 10 underlying one or more surfaces, e.g., surfaces 2 and 3, containing the newly formed semiconductor regions may be removed, as by mechanical polishing.

By iteratively diffusing one or more additional impurities into body 10 at least via inner bore surface 7, additional semiconductor regions substantially concentric with bores 20 may be formed. Later diffused impurities provide semiconducting regions of progressively lower resistivity and alternating conductivity type. Illustratively, in FIG. 6 there is shown, in schematic cross-section, the body of FIG. 5 following an additional iteration. The first-diffused impurity has been diffused to a depth $d_2$ below top 2 and bottom 3 major surfaces forming interfaces 31 and 32 with the material of body 10. The next-diffused impurity (the last-diffused in this illustration) has been diffused to a depth $r_2$ from inner bore surface 7 and has been diffused to a depth $d_3$ below top 2 and bottom 3 surfaces forming interfaces 33 and 34 with regions 27 and 28, respectively, formed by the first diffused impurity. Those skilled in the semiconductor arts will appreciate that the interfaces will provide p-N type junctions.

There are a number of devices which may be fabricated using the basic method of our invention described above. Descriptions of several devices made possible by our novel method are set forth below for illustrative purposes to instruct the reader in the utility of the method of our invention, but should not be considered as limiting.

In many applications, it is desirable to have an isolated feed-through interconnecting the major surfaces of the semiconductor body. This interconnect can be used as: (1) an additional means of addressing devices on the front of the body in order to reduce the space occupied by addressing lines on the front of the body; (2) as part of a large interwafer bus structure for a stack of bodies; and (3) as a means of avoiding excessive interference between addressing lines and switches in such applications as cross-over switches.

When semiconductor body 10 is processed in accordance with the method of our invention and appears as shown schematically in FIGS. 3 and 3A, semiconductor regions 21 will be the above-described feed-throughs. Interface 22, as a P-N junction with the proper reverse bias, isolates the signals traversing region 21 from the rest of the semiconductor body. As part of the processing to produce this structure, planar semiconductor regions 23 underlying and adjacent to surface 2 and surface 3 of body 10 (see FIG. 5) have either been removed or will have been prevented from forming. Alternatively, one planar region 23 could be made or left in place to form a common ground plane if the feed-throughs were to be used as grounds.

A structural variant using the above-discussed feed-throughs is that of an imager. If the matrix array of semiconductor regions 21 of FIGS. 3 and 3A are addressed individually, the array can be used to detect spatial variations in radiation intensity. Thus, the array can be used to image radiation over a predetermined part of the electromagnetic wave spectrum; that is, from gamma rays to the infrared. The array of FIG. 3A is typical of a matrix array wherein a bore is made at each intersection of a plurality of mutually orthogonal lines spaced apart by one distance (K) in one direction and by another distance (L) in the orthogonal direction. In the square matrix array of FIGS. 3A, K and L are equal, but other patterns are possible.

In another type of array, the bores are spaced, uniformly or in periodically repeating fashion, about the perimeter (periphery) of a plane geometric figure, e.g., square, circle or rectangle. The bore-axis-8-to-bore-axis-8 spacing may be made sufficiently small to permit semiconductor regions 21 concentric with adjacent bores 20 to touch or overlap, as discussed further below in Example III, forming thereby a semiconductor region surrounding a portion of the body.

If the imaging target is being addressed by an electron beam in a vacuum, as is the case with some vidicons, the laser-drilled through-thickness bores must be filled, i.e. made vacuum-sustaining, after the impurity is diffused into the body. The filling and sealing of the bores of the array can be easily accomplished by painting on the surface of the body an insulating substance, e.g., silicon-polyimide liquid or an epoxy liquid that is drawn by capillary force into the bores where it is then cured in place. The advantages of the silicon-polyimide is that it will withstand high temperatures (500° C. for ½ hour in pure oxygen), and that it exhibits no outgassing once it is cured. The advantage of the epoxy is that it shows no discernible shrinkage on curing.

As disclosed in Ser. No. 282,218, the high addressing resistance by electron beam for such an array limits the array size to about 250 diodes by 250 diodes. As further disclosed and claimed in Ser. No. 282,218, the size of the array can be vastly increased by using a solid state X-Y addressing scheme. Further, access to the diodes on both major surfaces of the body makes an X-Y addressing scheme very easy to implement. For example, on the top face of the body, all of the "X" address lines can be run in parallel, (as shown illustratively and schematically as line 35 in FIG. 3A) while on the rear face of the body the "Y" address lines can be run in parallel at a right angle to the "X" lines. In this manner, the interference and processing problems involved with prior art X-Y crossovers on one surface are avoided.

If semiconductor body 10 is processed in accordance with the method of our invention to produce the structure shown schematically in FIG. 5, a vertical junction geometry solar cell or radiation detector can be fabricated. The junction allowed by the drilled, diffused bore arrays fabricated by the method of our invention is associated with a low internal resistance that permits one to operate the solar cell at very high intensities without any loss of efficiency. Thus, this solar cell could be used in conjunction with a solar concentrator to produce electricity. A second advantage of the junction geometry shown in FIG. 5 for a solar cell is that this junction geometry is very resistant to radiation damage. Such radiation tolerance is important for solar cell applications in communications and TV transmission satellites. An additional fabrication step, well known to those skilled in the semiconductor arts, would be required to attach means to the semiconductor body 10 and the interconnected semiconductor regions 21 and 23 to bias the radiation detector or to receive the electricity from the solar cell.

Based on the configuration shown in FIG. 4, a guard ring can be fabricated using the basic method of our invention. A guard ring can be made by drilling a series of nearly overlapping bores about the periphery of a planar geometric figure, i.e., a ring, to a predetermined depth in a semiconductor body and exposing the body to an impurity in an annealing furnace. In the guard ring configuration, region 23 underlying top surface 2 in the areas between the bores and region 23 underlying bottom surface 3 would be removed or prevented from forming as described above. More complex devices having bores extending partially through the body 10 are made possible by the method of our invention.

In conventional semiconductor processing operations the semiconductor body is held in place on a chuck by applying a vacuum thereto. Thus, when holes penetrating the upper surface of the semiconductor body are employed in order to make electrical connections to the newly introduced semiconducting regions, the vacuum chuck is ineffective. This, of course, requires modification of the processing operations. Such modifications are readily made, but commercial application of this invention will be greatly facilitated if processing modifications can be avoided. It has been discovered that all of the benefits of the through-hole constructions of FIG. 3, together with some additional advantages, can be obtained by drilling holes extending in the semiconducting body from the bottom surface to the near-surface region of the top surface without penetrating or damaging the top surface as shown in FIG. 11. Thus, in FIG. 11, high aspect ratio hole 51 has been drilled in body 10 to a distance Y from surface 2, where Y has a value of from a maximum of about 1/5 the hole diameter to a minimum of 6 microns. Thereafter semiconducting region 52 was introduced having a conductivity type opposite to that of body 10 forming thereby a diode. The thickness of region 52 is such that it reaches to surface 2 to provide an area 53 in the plane of the surface having a diameter D. Diameter D, through which access can be had to region 52, should have a value of at least about 1 micron to facilitate the making of electrical contact thereto.

Holes meeting these requirements can be reproducibly drilled by using the laser multipulse operation at moderate laser power described hereinabove. By making electrical contact with areas 53, electrical connection is automatically established between devices on the top surface and the drilled diodes prepared in the diffusion step.

Because the top surface of semiconductor wafers prepared in this manner is unperforated as are conventional semiconducting wafers, standard processing is now possible. As an added benefit, tests of this type of drilled diode have shown, for some reason not fully explained, that leakage currents are smaller by a factor of three than are the leakage currents in drilled diodes employing through holes.

Examples of the practice of our invention are set forth below. These examples are provided to further instruct the reader in the practice of our invention and should not be construed as limiting in any respect the scope of our invention.

EXAMPLE I

Using the laser drilling parameters set forth above, a 200×200 square matrix array of bores was produced in a 12 mil thick 2 inch diameter wafer of 10 ohm-cm, N-type (phosphorous doped) silicon. A portion of the drilled wafer is shown in the 100× scanning electron micrograph of FIG. 7. The diameter of the bores is about 1 mil and the bores are located on centers (both ways) measuring about 5 mils. The front edge surface in FIG. 7, which shows the wafer and several bores in cross-section, was cut on a diagonal plane, which is substantially perpendicular to the top and bottom surfaces, to sequentially reveal increasingly longer cross-sections of the bores; thus some of the bores adjacent to that edge are not shown in cross-section. The apertures of the bores which are visible in FIG. 7 lie in the place of the (111) top major surface of the wafer. Any debris and surface roughness left on the inner bore surfaces can be removed by use of a chemical etch.

After the drilling operations, the wafer was checked to determine the extent to which any stresses or strains were introduced into the regions adjacent to the bores by the laser drilling operation. Polarized infrared light was used to check for the presence of stress since if stress is present the silicon becomes birefringent. No patterns indicative of stress in the silicon adjacent to the bores were observed.

Two methods were used to check for the presence of dislocations which are indicative of residual strains. In the first method, a saturated solution of $Cu(NO_3)_2$ was applied to the first major surface through which the laser beam would enter to drill the bores through the wafer. The wafer and solution were heated to 900° in dry hydrogen for one hour and quenched in air. Inspection with infrared light revealed an absence of copper-decorated areas, which would be indicative of the presence of dislocations, thus leading to the conclusion that the regions adjacent to the holes were strain-free. In the second method, Dash's Etch (1 part HF, 3 parts $HNO_3$ and 10 parts acetic acid) was applied to the first major surface at room temperature. The absence of any aggressive localized pitting attack of the silicon of the wafer adjacent to the bores indicated the absence of dislocations and confirmed the conclusion, based on the first method, that the regions adjacent to the bores were strain-free.

The strain-free and stress-free regions adjacent to the bores are the result of the innovative selection of multipulse laser-drilling parameters. The short laser pulses employed minimize the diffusion of heat into the silicon surrounding the bore and, therefore, minimize any resulting thermal stress and damage to the silicon.

Next, the drilled silicon wafer was placed on a vacuum hold-down chuck and several drops of liquid "spin-on" solid state type boron-rich diffusible impurity, such as Spin-Rite TM available from Diffusion Technology Inc. of Sunnyvale, CA., were applied to the uppermost top major surface. Normally, the wafer would be spun rapidly on the hold-down chuck to spread a thin uniform layer of the impurity over the surface of the water. The large number of bores, however, prevented the use of the vacuum chuck in the conventional manner, but spinning was unnecessary as the spin-on liquid spread uniformly over the top surface, down into the through bores, and across the bottom surface adjacent to the chuck under the combined action of surface tension, capillary force and the vacuum.

The coated wafer was baked at 150° C. for 1 hour under a nitrogen atmosphere to drive off any residual solvent. In preparation for the pre-deposit bake, the wafer was placed in a cold laboratory oven and a flow of 500 cc/min $O_2$ plus 2000 cc/min $N_2$ was initiated. The wafer was next heated up to 1100° C., held at 1100° C. for 30 minutes, cooled in the oven at about 1.5° C./min to 600° C., removed from the oven and cooled to room temperature in still air. The oxide layer was removed using HF acid. The impurity was then diffused deeply into the interior of the wafer by heating the wafer in a laboratory oven from room temperature to 1250° C., holding at 1250° C. for 15 hours, cooling in the laboratory oven at about 1.5° C./min to 600° C., removing from the oven and cooling to room temperature in still air. Since the same $O_2/N_2$ flowing atmosphere used during the pre-bake step was used during the diffusion step, the resultant wafer had a new oxide film which could either be patterned or removed. Since, by the novel method of this invention, the impurity has simultaneous access to at least the entire cross-section of the wafer in the regions in which the impurity is to be introduced, i.e., the inner bore surfaces, the overall impurity diffusion and device fabrication times are considerably reduced over those of the prior art methods.

After completion of the diffusion operation, approximately 60 microns of material were removed from the top surface by mechanical polishing to expose a new surface below the semiconductor region formerly adjacent to the top surface. The wafer was then treated to produce FIG. 8 which is a top view showing a portion of the as-polished and treated surface at 100×. The diameter and spacing of the bores in FIG. 8 appear to be different from those in FIG. 7 due to the effect produced by tilting the wafer in the scanning electron microscope to produce FIG. 7.

The treatment consisted of placing the wafer in a solution of 1 part HF, 3 parts $HNO_3$, 10 parts acetic acid, and 1 part saturated $Cu(NO_3)_2$ and shining ultraviolet light onto the top surface. The ulraviolet light caused miniature solar cells to be established between the N-type silicon of the wafer and the P-type regions concentric with and defining the bores. The potential difference between the cathodic P-type region and the anodic N-type region caused copper to plate out on the P-type regions immediately adjacent to the bores and from the dark rings 40 visible in FIG. 8. This treatment revealed that each of the 40,000 holes of the wafer was generally uniformly surrounded by a substantially concentric P-type region.

Figure 8:
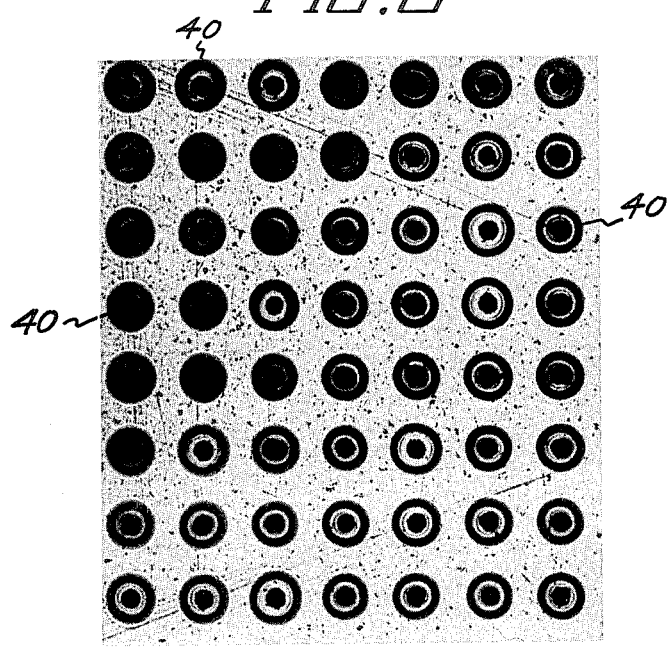
FIG. 8 is a photomicrograph at 100X of the square matrix array of bores of FIG. 7 following diffusion of a first impurity to create the dark semiconducting regions concentric with each bore. The flat surface of FIG. 8 is approximately 60 microns below the top surface observable in FIG. 7.
Figure 9:
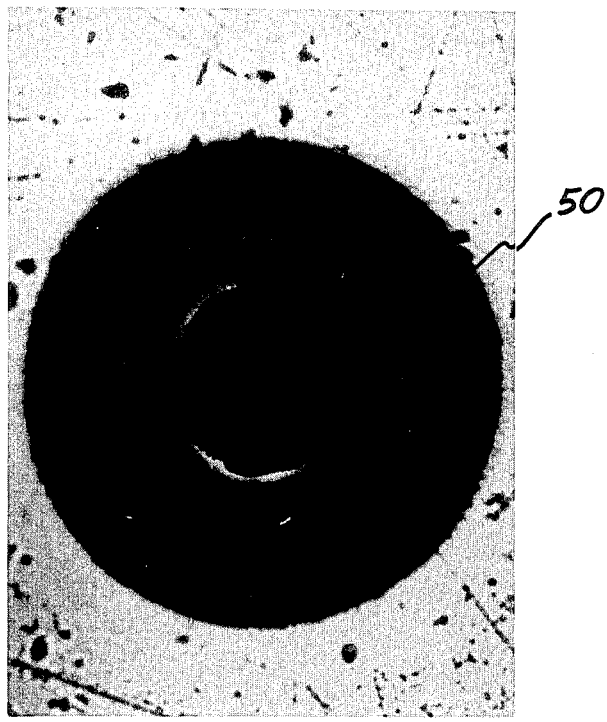
FIG. 9 is a photomicrograph at 1250X of one of the bores of FIG. 8 and the substantially concentric semiconductor region associated therewith.

A closeup of one bore from FIG. 8 is shown at 1250× in FIG. 9. Although the interior surface of the bore is somewhat irregular on a microscopic scale, i.e., jagged, the impurity has diffused uniformly from the inner bore surface approximately 22 microns into the silicon to form a P-N junction 50 which is substantially concentric with the bore as viewed in the place of FIG. 9. The gradation of dark tones within the dark P-type region is caused by a variation in the amount of copper plated out due to the gradation in impurity concentration with distance from the surface of the bore to P-N junction 50.

EXAMPLE II

Using the method of Example I, a similar matrix array of bores approximately 1 mil in diameter on centers approximately 5 mils apart was laser-drilled in a 2 inch diameter, 10 ohm-cm, N-type (phosphorous doped) silicon Wafer. A P-type impurity (Al) in a carrier gas having the nominal composition of 7% $H_2$/93% Ar was diffused into the wafer for about 35 hours. The top surface of the wafer was mechanically polished to a depth of about 60 microns below the original top surface of the wafer to remove the layer-like semiconductor region formed contiguous with and underlying the top surface. Using the methods described in Example I, it was confirmed that the P-type regions concentrically surrounded all bores and formed interfaces with the material of the wafer at a radial distance of approximately 1 mil beyond the inner bore surface as measured in the plane of the polished surface. The method of this Example was repeated using P-type gallium as the impurity, except that the diffusion time was about 72 hours at 1120° C., with the same results as obtained using the Al impurity.

EXAMPLE III

Using the laser drilling parameters set forth above, a 123 bore × 123 bore square pattern of bores about 1 mil in diameter having a bore axis-to-bore axis distance of about 1.5 mils was drilled about the periphery of a plane geometric figure, the edges of a square in this example, in a 12 mil thick 10 ohm-cm [(5 × $10^{14}$ atoms/$cm^3$ N-type (phosphorus doped)] 2 inch diameter silicon wafer to form an isolation grid.

Figure 10:
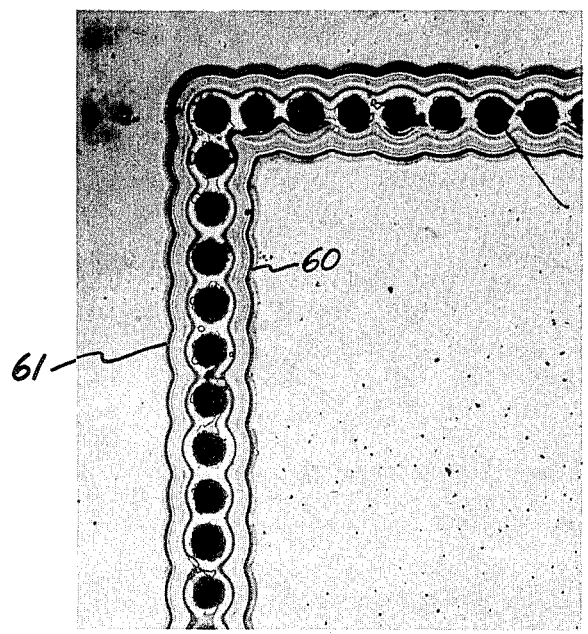
FIG. 10 is a photomicrograph at 150X of a corner of an array of laser-drilled bores forming an isolation grid, the holes being approximately 1 mil in diameter and arranged on centers approximately 1½ mils apart around the periphery of a square.

Spin-on P-type boron was diffused into the wafer using the method described in Example I. The diffused wafer was prepared for observation of the P-N junctions in the manner described in Example I. FIG. 10 is a photomicrograph at 150× of a corner of the square isolation grid. As can be seen from FIG. 10, the concentric semiconductor regions of adjacent bores have intersected and partially overlapped forming a continuous P-N array junction 60 interior to the periphery of the square and a second continuous P-N junction 61 exterior to the periphery of the square.

While the above described isolation region may be made by causing the interfaces of adjacent concentric regions to simply touch, it is preferable that there be a partial overlap in order that the distinct nearly straight continuous array junctions 60 and 61 visible in FIG. 10 be produced. If more than one semiconductor region is formed concentric with each bore, the resulting interfaces may be arranged so as to form a plurality of array junctions. It should be appreciated that if this embodiment of our invention is practiced with a faster-diffusing impurity species, e.g., Al, fewer bores, on centers further apart than in this example, need be provided.

In order to assess the capability for drilling very high aspect ratio holes, a series of holes were drilled through a 330 micron thick silicon-on-sapphire (SOS) wafer. In the examples to follow a frequency doubled Nd:YAG Q-switched laser (0.532 micron wavelength) was used and operated at different power levels in the two examples.

EXAMPLE IV

The laser was operated at 300 milliwatt output CW (continuous wave) in the pulsed mode with the beam focussed on the surface of the wafer. The laser was pulsed at 1000 Hz using a pulse duration of 100 nanoseconds and operating at peak power of 3 kw during each pulse, the holes were drilled at the rate of one second per hole. The resulting holes were found to have entrance diameters of 10 microns and exit diameters of 6 microns for an average aspect ratio of 40:1.

EXAMPLE V

The laser was operated at 450 milliwatt output CW in the pulsed mode and focussed as in EXAMPLE IV. Operating at peak power of 4.5 kw during each pulse, the holes were drilled at the rate of 0.8 second per hole. The resulting holes were found to have entrance diameters of 18 microns and exit diameters of 9 microns for an average aspect ratio of 24:1.

While our invention has been particularly shown and described with reference to several preferred embodiments thereof, it will be understood by those skilled in the art that various changes in form and detail may be made therein without departing from the true spirit and scope of the invention as defined by the appended claims.

What we claim as new and desire to secure by Letters Patent of the United States is:

1. In a semiconductor device wherein a semiconductor body has at least one clean, well-defined bore extending partially therethrough, said bore being defined by a first semiconducting region having a conductivity type opposite to, and resistivity lower than, the material of said body located contiguous with said first semiconducting region along an interface, the improvement wherein each said bore has a diameter of less than about 1.5 mils and an average length-to-diameter ratio of at least about 6:1, said first region defining said bore is free of dislocations and said bore extends to a predetermined depth such that the bottom of said bore is adjacent a major surface of said semiconductor body and is spaced therefrom a distance in the range of from a maximum distance of about one-fifth the hole diameter to a minimum distance of 6 microns.

2. The improved device of claim 1 wherein the first semiconducting region penetrates to the major surface and is present at said surface as a circularly shaped area having a diameter of at least one micron.

3. The improved device of claim 6 wherein the diameter is about 1 mil and the average length-to-diameter ratio is at least about 12:1.

4. The improved device of claim 6 wherein a plurality of bores are arranged in an array with the bores substantially parallel to each other and spaced about 5 mils apart center-to-center.

5. The improved device of claim 6 wherein a plurality of bores are arranged in an array with the bores substantially parallel to each other and spaced about 1.5 mils apart center-to-center.

6. The improved device of claim 1 wherein the average length-to-diameter ratio is in the range of from about 6:1 to about 50:1.

* * * * *